US011609296B2

(12) United States Patent
Guisan et al.

(10) Patent No.: US 11,609,296 B2
(45) Date of Patent: *Mar. 21, 2023

(54) METHOD FOR MEASURING SATURATION MAGNETIZATION OF MAGNETIC FILMS AND MULTILAYER STACKS

(71) Applicant: Taiwan Semiconductor Manufacturing Company, Ltd., Hsinchu (TW)

(72) Inventors: Santiago Serrano Guisan, San Jose, CA (US); Luc Thomas, San Jose, CA (US); Guenole Jan, San Jose, CA (US); Son Le, Gilroy, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 163 days.

This patent is subject to a terminal disclaimer.

(21) Appl. No.: 17/035,153

(22) Filed: Sep. 28, 2020

(65) Prior Publication Data

US 2021/0025958 A1    Jan. 28, 2021

Related U.S. Application Data

(63) Continuation of application No. 16/161,166, filed on Oct. 16, 2018, now Pat. No. 10,788,561.

(51) Int. Cl.
*G01R 33/60* (2006.01)
(52) U.S. Cl.
CPC .................... *G01R 33/60* (2013.01)
(58) Field of Classification Search
CPC ......... H01L 43/10; H01L 43/02; H01L 43/12; H01L 27/228; H01L 27/222; H01L 43/08;
(Continued)

(56) References Cited

U.S. PATENT DOCUMENTS 3,873,463 A * 3/1975 Tolksdorf ................ C30B 29/28
117/945
5,041,782 A 8/1991 Marzan
(Continued)

FOREIGN PATENT DOCUMENTS

WO    WO 2017171848    10/2017

OTHER PUBLICATIONS

Kalarickal, Sangita S., et al., "Ferromagnetic resonance linewidth in metallic thin films: Comparison of measurement methods", Journal of Applied Physics 99, 093909 (2006), May 15, 2006, American Institute of Physics, 7 pages.
(Continued)

*Primary Examiner* — Christopher P McAndrew
*Assistant Examiner* — Zannatul Ferdous
(74) *Attorney, Agent, or Firm* — Haynes and Boone, LLP (57) ABSTRACT

A ferromagnetic resonance (FMR) measurement method is disclosed wherein a magnetic film or stack of layers is patterned into elongated structures having a length along a long axis. A magnetic field (H) is applied in two different orientations with respect to the long axis (in-plane parallel and perpendicular to the long axis) or one orientation may be perpendicular-to-plane. In another embodiment, H is applied parallel to a first set of elongated structures with a long axis in the x-axis direction, and perpendicular to a second set of elongated structures with a long axis in the y-axis direction. From the difference in measured resonance frequency (Δfr) (for a fixed magnetic field and sweeping through a range of frequencies) or the difference in measured resonance field (ΔHr) (for a fixed microwave frequency and sweeping through a range of magnetic field amplitudes), magnetic saturation Ms is determined using formulas of demagnetizing factors.

20 Claims, 6 Drawing Sheets

(58) Field of Classification Search
CPC ..... H01L 27/224; H01L 29/517; H01L 28/10; G01N 33/563; G01R 33/12; G01R 33/485; G01R 33/54
See application file for complete search history.

(56) References Cited

U.S. PATENT DOCUMENTS

| | | | |
|---|---|---|---|
| 5,889,402 A * | 3/1999 | Kumatoriya | H01P 1/215 |
| | | | 324/321 |
| 7,197,813 B2 | 4/2007 | Mukoyama et al. | |
| 7,417,442 B2 | 8/2008 | Hachisuka et al. | |
| 7,545,139 B2 | 6/2009 | Saruki et al. | |
| 8,102,174 B2 | 1/2012 | Worledge et al. | |
| 8,264,693 B2 | 9/2012 | Stoica et al. | |
| 8,633,720 B2 | 1/2014 | Tudosa et al. | |
| 8,959,980 B2 | 2/2015 | Vodnick et al. | |
| 9,030,216 B2 | 5/2015 | Lamson et al. | |
| 9,846,134 B2 | 12/2017 | Yang et al. | |
| 10,788,561 B2 * | 9/2020 | Guisan | G01R 33/60 |
| 2009/0212769 A1 | 8/2009 | Stoica et al. | |
| 2010/0023294 A1 | 1/2010 | Fan et al. | |
| 2010/0103639 A1 | 4/2010 | Pulugurtha et al. | |
| 2012/0326712 A1 * | 12/2012 | Tudosa | G01R 33/093 |
| | | | 324/252 |
| 2014/0070800 A1 | 3/2014 | Cho et al. | |
| 2014/0097841 A1 | 4/2014 | Yang et al. | |
| 2016/0372212 A1 | 12/2016 | Kishi | |
| 2017/0097393 A1 | 4/2017 | Yuan et al. | |
| 2017/0176548 A1 * | 6/2017 | Wu | G01R 33/032 |
| 2017/0336482 A1 * | 11/2017 | Hwang | G01R 33/26 |
| 2018/0267128 A1 * | 9/2018 | Guisan | G01R 31/318511 |
| 2018/0301266 A1 | 10/2018 | Ou et al. | |
| 2019/0049514 A1 | 2/2019 | O'Brien et al. | |
| 2020/0116811 A1 | 4/2020 | Guisan et al. | |

OTHER PUBLICATIONS

Bilzer, C. et al., "Vector network analyzer ferromagnetic resonance of thin films on coplanar waveguides: Comparison of different evaluation methods", AIP Journal of Applied Physics 101, 074505 (2007), Apr. 12, 2007, American Institute of Physics, http://dx.doi10.1063/1_2716995, 5 pgs.

Bilzer, C. et al., "Open-Circuit One-Port Network Analyzer Ferromagnetic Resonance", IEEE Transactions on Magnetics, vol. 44, No. 11, Nov. 2008, pp. 3265-3268.

Bilzer, Claus, "Microwave susceptibility of thin ferromagnetic films: metrology and insight into magnetization dynamics", Jan. 8, 2008, Universite Paris Sud—Paris XI, 2007, Chapter 2.1.1, 2.1.2, 13 pgs.

Wilkinson, Ernest J., "An N-Way Hybrid Power Divider", IRE Transactions on Microwave Theory and Techniques, vol. 8, Issue 1, Jan. 1960, pp. 116-118.

PCT Search Report, International Application No. PCT/US2018/020361, Applicant: Headway Technologies, Inc., dated Jul. 6, 2018, 21 pgs.

Pozar, David M., "Microwave Engineering 4th ed", Dec. 1, 2011, Chapter 3, Transmission Lines and Waveguides, pp. 95, 158, XP055486442.

Dragos, Mircea I. et al., "Near-field microwave probe for local ferromagnetic resonance characterization", Applied Physics Letters, AIP Publishing LLC, US, vol. 90, No. 14, Apr. 2, 2007, pp. 142504-1 to 142504-3.

Aharon, Amikam, "Demagnetizing factors for rectangular ferromagnetic prisms", Journal of Applied Physics, vol. 83, Issue 6, Jun. 1998, pp. 3432-3434.

Safranski, C.J. et al., "Material parameters of perpendicularly magnetized tunnel junctions from spin torque ferromagnetic resonance techniques", Applied Physics Letters, 109, 132408, Sep. 2016, pp. 1-4.

* cited by examiner

METHOD FOR MEASURING SATURATION MAGNETIZATION OF MAGNETIC FILMS AND MULTILAYER STACKS

PRIORITY DATA

The present application is a continuation application of U.S. application Ser. No. 16/161,166, filed on Oct. 16, 2018, which is herein incorporated by reference in its entirety.

RELATED PATENT APPLICATIONS

This application is related to Ser. No. 15/463,074, filing date Mar. 20, 2017; Ser. No. 15/875,004, filing date Jan. 19, 2018; and Ser. No. 16/056,783, filing date Aug. 7, 2018; which are assigned to a common assignee and are herein incorporated by reference in their entirety.

TECHNICAL FIELD

The present disclosure relates to a ferromagnetic resonance (FMR) method for measuring saturation magnetization (Ms) in magnetic films and multilayer stacks that are patterned into elongated structures, such as parallel stripes, and in particular, to measuring FMR spectra of the patterned structures on whole wafers along at least two different orientations of the magnetic field with respect to the long axes of such structures and then calculating Ms from the difference in resonance field, or from the difference in resonance frequency of the two measurements.

BACKGROUND

Magnetic thin films and multilayers play a key role in various types of magnetic storage devices such as a magnetic hard disk (HDD) drive, Magnetic Random Access Memory (MRAM), spin torque oscillator (STO), and magnetic domain wall devices. In order to develop and optimize such devices, monitoring and characterization of magnetic thin film stacks are necessary. A variety of different magnetic characterization techniques must be used to determine all the essential magnetic parameters such as crystalline anisotropy, surface or interface anisotropy, magnetization saturation (Ms), damping constant ($\alpha$), gyromagnetic ratio ($\gamma$), inhomogeneous broadening, resistance x area product (RA), and magnetoresistive ratio (MR).

Some of the aforementioned parameters (RA and MR) can be determined on industry-sized wafers (having diameters of 6, 8, 12 inches or more) by non-invasive transport measurements such as Current-in-Plane Tunneling (CIPT). The other magnetic parameters are usually determined by either FMR techniques (to derive anisotropy fields (Hk), gyromagnetic ratio $\gamma$, damping constant $\alpha$, or inhomogeneous broadening ($L_0$), or by one or both of Vibrating Sample Magnetometry (VSM) and Superconducting Quantum Interference Device (SQUID) magnetometry to determine Ms. However, these techniques typically require cutting wafer-sized magnetic films into small coupons thereby making such characterization tools destructive, impractical, and time and labor intensive, which adversely impacts cost.

In the prior art, a FMR measurement is generally performed with a method that involves probing the magnetic system (thin film, multilayer stack, or structured device) with a combination of microwave excitation and a quasi-static magnetic field. FMR data is obtained by either sweeping the magnetic field at a constant microwave frequency, or by sweeping the frequency at a constant field. When the ferromagnetic resonance condition is achieved, it may be detected by an enhanced absorption of the microwave (RF signal) by the ferromagnetic sample. Thus, resonance (FMR) conditions are defined with pairs of magnetic field (Hr) and microwave frequency values (fr) for each resonance condition. As indicated earlier, FMR measurements that use pieces of wafers are not acceptable in an industrial environment because of cost. Furthermore, it is desirable to be able to obtain Ms data in addition to Hk, $\gamma$, $\alpha$, and $L_0$ results using only one measurement method for increased efficiency. Therefore, an improved FMR measurement method is needed that enables fully automated measurements on whole wafers, and is capable of determining Ms values. The improved FMR measurement method should also be capable of obtaining the aforementioned data on patterned stacks of films such as a magnetic tunnel junction (MTJ) stack.

SUMMARY

One objective of the present disclosure is to provide a FMR method for determining Ms in magnetic films including MTJ stacks of layers on a whole wafer.

A second objective of the present disclosure is to provide a FMR method according to the first objective that has flexibility in applying different magnetic field orientations, and in the size of patterns used for the measurements.

These objectives are achieved according to one embodiment of the present disclosure when utilizing a FMR measurement system that is configured around a controller (computer) linked to an electrical probe station. The FMR measurement system may be based on an inductive technique as described in related patent application Ser. Nos. 15/463,074, 15/875,004, or may employ one or more probes adjoined to a mounting plate that also holds a magnetic assembly comprised of one or more magnetic field sources that is described in related patent application Ser. Nos. 15/875,004 and 16/056,783. Thus, the FMR measurement of the present disclosure may be performed with a fully automated wafer level FMR apparatus described in the related patent applications. The magnetic assembly may be configured to apply a magnetic field "perpendicular-to-plane", and one or more RF probes on the mounting plate may contact a plurality of predetermined locations on the magnetic film so that multiple sites are measured consecutively or simultaneously.

In another embodiment, the magnetic assembly comprises two magnetic poles that are positioned on either side of the RF probe (or 2 m magnetic poles where a magnetic pole in each pair of magnetic poles is disposed on each side of one of the "m" RF probes where m is an integer ≥2) thereby providing an in-plane magnetic field to the magnetic film at each predetermined test location during a FMR measurement. The magnetic poles are in proximity to the magnetic film but do not contact a top surface thereof.

According to one embodiment that represents a RF transmission mode for performing the FMR measurements, a RF input signal passes through a signal (S) pathway in the probe tip while a magnetic field is applied to the magnetic structure contacted by the RF probe tip. When the RF current excites the magnetic layers in the test structure, there is a power loss that is transmitted in a RF output signal through a signal pathway and detected by a RF diode. The RF diode may be linked to an analog-to-digital converter (ADC), which transmits the data through an optional data acquisition (DAQ) system to the controller. The transmitted RF power through the test structure is measured for different applied RF (microwave) frequencies as a function of a fixed magnetic field (H), or by sweeping with different values of H while a fixed microwave frequency is applied.

In an alternative embodiment where FMR measurements are performed in a reflectance mode, the components in the first embodiment are retained except a directional coupler is inserted in the RF circuit so that only one S pathway in the RF probe tip is necessary since the RF input signals and RF output signals pass through the same S pathway to and from the directional coupler. The RF output signals are sent from the directional coupler to the RF diode and then to the ADC, DAQ system, and controller.

The FMR measurement method of the present disclosure also comprises patterning the film stack into a plurality of stripes or other elongated features of known dimensions including length L, width w, and thickness t on a wafer under test (WUT). Thereafter, FMR spectra are obtained by applying a magnetic field (H) along two different orientations while sweeping through a range of RF frequencies at the test locations, or by sweeping through different H at a fixed RF frequency. For example, a first magnetic field is applied in the x-axis direction and a second magnetic field is applied in the y-axis direction when the stripe pattern has a lengthwise direction along the x-axis and a widthwise direction along the y-axis. Alternatively, the first magnetic field is applied in the x-axis (or y-axis) direction, and the second magnetic field is applied in the z-axis (perpendicular-to-plane) direction. Moreover, a first set of stripes may have a lengthwise direction along the x-axis while a second set of stripes has a lengthwise direction along the y-axis to avoid having to rotate the WUT or switch the magnetic assembly between the first and second applied fields. Ms is calculated from the difference in resonance field or from the difference in resonance frequency between the two measurements, using the known expressions of demagnetizing factors Nx and Ny along the long and short dimensions of the stripes, respectively, as described herein.

DETAILED DESCRIPTION

The present disclosure is a FMR measurement method of determining magnetization saturation (Ms) in a magnetic film or stack of layers that is patterned into a least one elongated structure, such as a stripe, or set of elongated structures with a lengthwise direction along one of the x-axis and y-axis direction on a wafer, and the widthwise direction along the other of the x-axis and y-axis direction, and where FMR spectra are obtained for two different orientations of a fixed magnetic field while sweeping through a range of microwave frequencies, or by sweeping the magnetic field through a range of values at a fixed microwave frequency. Ms is calculated from a difference in resonance field or from a difference in resonance frequency for FMR measurements involving the two different magnetic field orientations. The x-axis and y-axis directions are in the plane of the wafer under test (WUT), and the z-axis is perpendicular to the plane of the magnetic film formed on the WUT. The terms "RF" and "microwave" may be used interchangeably, and "controller" and "computer" may be used interchangeably.

In related U.S. patent application Ser. No. 15/463,074, we disclosed a FMR measurement system that relies on a waveguide transmission line (WGTL) that is attached to RF input and RF output connectors and is capable of taking FMR measurements at a plurality of sites on a whole wafer to determine magnetic parameters including anisotropy fields (Hk), gyromagnetic ratio γ, damping constant α, and inhomogeneous broadening ($L_0$). Later, in U.S. patent application Ser. No. 15/875,004, we disclosed a modified FMR measurement system where a RF electrical probe is formed on a mounting plate with a magnetic assembly to perform FMR measurements. Then, in U.S. patent application Ser. No. 16/056,783, we disclosed how multiple RF probes and multiple magnetic field sources may be formed on a mounting plate above a WUT in a fully automated FMR measurement system to perform either a plurality of FMR measurements consecutively or simultaneously at a plurality of predetermined sites on a WUT.

Here we disclose a method to determine Ms data in addition to Hk, γ, α, and $L_0$ for patterned magnetic films using one of the configurations for the FMR apparatus described in the related patent applications. It should be understood that other systems enabling FMR characterization in small coupons of patterned magnetic films could be used to determine Ms by this method. Other metrology techniques such as Magneto Optical Kerr Effect (MOKE) or Anomalous Hall Effect (AHE) may be used to measure Ms of a patterned structure. However, the FMR measurement method disclosed herein is believed to provide more accurate data that is readily calculated, and has the additional advantage of providing data that enables other magnetic parameters besides Ms to be derived.

There are other methods of determining Ms that are based on measuring demagnetizing fields as a function of lateral dimensions in nanopillar structured magnetic devices such as "Material parameters of perpendicularly magnetized tunnel junctions from spin torque ferromagnetic resonance techniques", C. Safranski et al., Applied Phys. Letters 109, 132408 (2016). The idea of such approach is that process related damage, which relates to variations in lateral dimensions, interfacial properties, and/or morphology, from magnetic structure to magnetic structure can lead to a dispersion of magnetic properties such as Ms, Hk or even demagnetizing factors and therefore induce a size dependence of such magnetic properties. However, the Ms measurements based on fitting this size dependence would be prone to many assumptions and approximations and therefore to errors. The FMR measurement method disclosed herein only requires measuring magnetic stripes with a single width and length along two different directions, which means the method is essentially insensitive to edge damage since the edge effect will cancel out.

Figure 1:
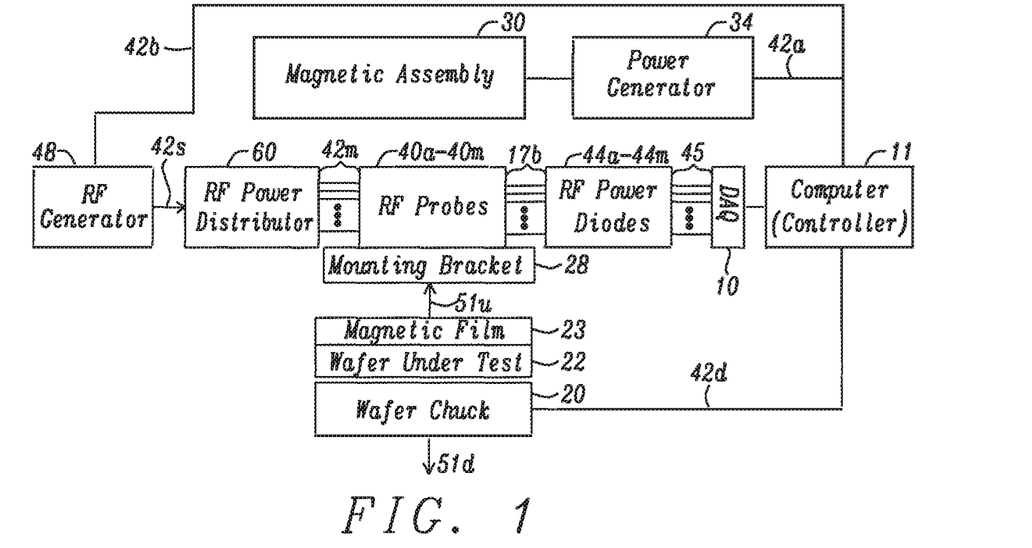
FIG. 1 is a schematic drawing of a FMR measurement system that may be used to perform the FMR measurement method of the present disclosure on a wafer level.

Referring to FIG. 1, a schematic drawing is shown with the key components of a FMR measurement system that may be employed for the FMR measurement method of the present disclosure. There is a computer 11 to manage the up movement 51$u$ or down movement 51$d$ of the prober stage also known as wafer chuck 20, and WUT 22 on which the magnetic film 23 to be tested is formed. The wafer chuck and WUT may be raised with respect to the mounting plate so that each of the "m" RF probes 40$a$-40$m$ contacts or is proximate to a predetermined test location on the WUT where "m" is an integer ≥2. An electrical probe station may be employed to position the mounting plate above the WUT with respect to lateral movement (x-axis and y-axis directions), and also to manage the vertical approach to adjust contact or proximity to the WUT as directed by the controller. However, in another embodiment, the RF probes may be attached to a probe card.

The magnetic assembly 30 is comprised of at least one magnetic field source, but may include a plurality of "k" magnetic poles (where k is an integer 1≤k≤m) in some embodiments. In other embodiments, the magnetic assembly may comprise one or more coils of superconducting wires so that no magnetic poles are necessary. Computer 11 has a link 42$a$ to power generator 34 (or a plurality of power generators) that produces power to form magnetic flux in one or more magnetic poles or coils in the magnetic assembly. A magnetic field of up to 10 Tesla is applied simultaneously or consecutively to "m" different predetermined ($x_i$, $y_i$) coordinates (test locations) on the WUT while a RF signal pathway in each RF probe 40$a$-40$m$ contacts or is within about 100 microns of the magnetic film top surface at each ($x_i$, $y_i$) coordinate.

As indicated in each of the aforementioned related patent applications, the magnetic field may be applied perpendicular to the plane of the WUT, or in-plane. In the former case, a range of RF microwave frequencies from 1 GHz to 100 GHz may be employed. With the in-plane magnetic field option, the range of usable RF microwave frequencies is between 0.01 GHz to 100 GHz.

Controller 11 has an electrical connection 42$b$ to RF generator 48 that provides a RF input signal 42$s$ to one or more RF power distribution devices 60 such as a broadband RF power divider, or one or more broadband RF directional coupler devices. RF input signals may be delivered to each of the RF probes by using RF power distribution devices or RF power routing devices. Simultaneous application of a microwave frequency (RF input signal) through a first signal pathway in a RF probe, and an applied magnetic field (H) of up to 10 Tesla from a magnetic pole induces a FMR condition (RF power absorbance) in the magnetic film proximate to each ($x_i$, $y_i$) coordinate on the WUT. Each FMR measurement comprises sweeping a range of microwave frequencies while applying a fixed H, or sweeping through a range of H values at a fixed microwave frequency.

In one preferred embodiment, the RF output signal from each RF probe 40$a$-40$m$ is detected by one of the RF diodes 44$a$-44$m$, which collects a RF output signal transmitted from the magnetic film and that exits each RF probe through a second signal pathway in a transmission mode or through the first signal pathway in a reflectance mode. Each RF output signal corresponds to a RF power loss caused by the FMR condition where a certain amount of microwave power is absorbed and excites the magnetic film to a resonance state. Each FMR measurement at a ($x_i$, $y_i$) coordinate may comprise a plurality of RF input signals each corresponding to a different RF frequency.

In one preferred operating mode for a FMR measurement, the applied magnetic field is varied (swept from a minimum to a maximum value) at a constant microwave frequency. The FMR measurement is preferably repeated by sweeping the magnetic field successively through each of a plurality of different microwave frequencies. In one embodiment, each RF diode 44$a$-44$m$ converts the power output from one of the plurality of "m" RF probes 40$a$-40$m$ to a voltage signal that is transmitted to a Data Acquisition (DAQ) system 10. This DAQ system digitizes the voltage output signals from each RF probe, allowing them to be processed by the controller 11. Thereafter, the controller 11 calculates one or more of $H_k$, $\alpha$, $\gamma$, inhomogeneous broadening ($L_0$), and Ms based on each pair of applied magnetic field value and applied microwave frequency used to establish a FMR condition, and on voltage output data from each RF diode.

Figure 2:
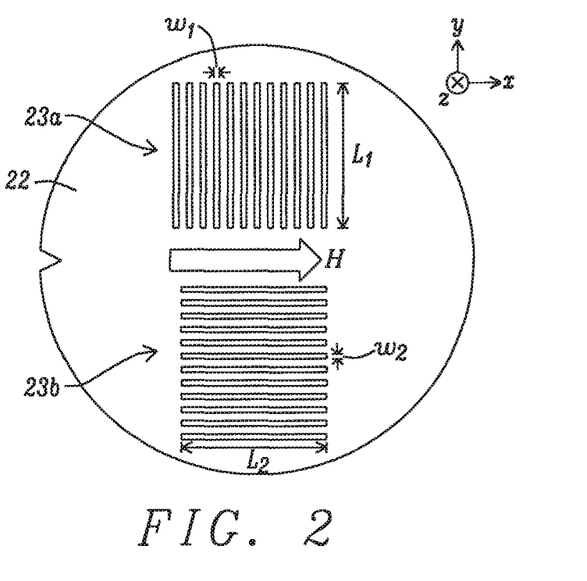
FIG. 2 is a top-down view showing two sets of stripes with dimensions L and w on a wafer, and with a long axis parallel and transverse to the applied in-plane magnetic field (H) according to a first embodiment of the present disclosure.

Referring to FIG. 2, one FMR measurement method of the present disclosure comprises forming a first set of stripes 23$a$ and a second set of stripes 23$b$ in a magnetic film on WUT 22 where each stripe has an asymmetrical shape with a widthwise dimension unequal to a lengthwise dimension. In the exemplary embodiment, stripes 23$a$ have a substantially rectangular shape with length $L_1$ in the y-axis direction, and width $w_1$ in the x-axis direction. In alternative embodiments (not shown), the stripes may have a substantially elliptical or another elongated shape. The stripes are typically formed by a conventional photolithography technique where a photoresist film is coated on the magnetic film, patternwise exposed, and then developed to form openings between the desired stripe shapes. Then, a reactive ion etch (RIE) or ion beam etch (IBE) removes portions of magnetic film that are not protected by the remaining photoresist layer thereby transferring the pattern through the magnetic film. There is also a second set of stripes 23$b$ in the magnetic film where each of the substantially rectangular shapes has a length $L_2$ in the x-axis direction and width $w_2$ in the y-axis direction. In a preferred embodiment, $w_1=w_2$, and $L_1=L_2$, and $L_1>w_1$. $L_1$ and $L_2$ are preferably greater than 50 nm, and have a maximum value proximate to a diameter of the WUT. The thickness "t" (not shown) of the magnetic film is preferably from 5 Angstroms to 50 Angstroms and $<w_1$, but has a minimum value of 1 Angstrom and a maximum value of around 2 microns. Both sets of stripes are "patterned" simultaneously using the aforementioned photolithography and etching sequence. The photoresist is removed with a conventional method after the IBE or RIE.

The number of stripes may be adjusted depending on the configuration of the FMR measurement system in order to ensure an appropriate signal-to-noise ratio (SNR). A maximum RF output signal is obtained when the magnetic film stripe has a width that is greater than or equal to a largest side in the cross-sectional area (footprint) of the RF probe used to characterize the magnetic film at predetermined locations. The RF probe may be a RF electrical probe or optionally a WGTL, or RF probe end, a grounded coplanar waveguide (GCPWG), coplanar waveguide (CPWG), coaxial waveguide (CWG), stripline (SL), a microstrip (MS) or any other waveguide transmission line (WGTL) that is used to transmit and detect RF signals.

In one preferred embodiment, a magnetic field (H) is applied in a fixed direction (parallel to the x-axis or y-axis) with respect to the WUT. The dimensions of the stripes determine the values of the demagnetizing factors Nx, Ny, and Nz according to "Demagnetizing factors for rectangular ferromagnetic prisms", A. Aharoni, J. Applied Physics 83, 432 (1998). Thus, the relationship Nz>Ny>Nx is implied when $L_1 > w_1 > t$ as in the first set of stripes 23a, and when $L_2 > w_2 > t$ as in the second set of stripes 23b. The demagnetizing components Dx, Dy, and Dz are related to the demagnetizing factors according to the following equations: $Dx = 4\pi Ms \times Nx$; $Dy = 4\pi Ms \times Ny$, and $Dz = 4\pi Ms \times Nz$ where $(Nx+Ny+Nz)=1$.

The FMR measurement method of the present disclosure is based on the application of two different magnetic field orientations to at least one set of "h" stripes where h is an integer ≥1. According to a first embodiment shown in FIG. 2, an in-plane field H is oriented parallel to $L_2$ (to the long axis of stripes 23b), and H is simultaneously oriented transverse to $L_1$ (to the long axis of stripes 23a). In other words, the FMR measurements may be performed with only one in-plane applied field direction when two sets of stripes 23a, 23b are formed on the WUT 22, and one set of stripes has a long axis aligned orthogonal to the long axis of the other set. At least one RF probe is necessary to provide RF input signals and receive RF output signals from stripes 23a, and at least one RF probe is needed to provide RF input signals and receive RF output signals from stripes 23b when H is applied. The present disclosure anticipates there may be a minimum of one stripe 23a, and one stripe 23b depending on the size of $L_1$, $L_2$, $w_1$, and $w_2$. The FMR measurement system that may be used to provide the required in-plane field has been described in related U.S. patent application Ser. No. 15/875,004, and preferably comprises a reflectance mode for microwave signal transmission.

Figure 3A:
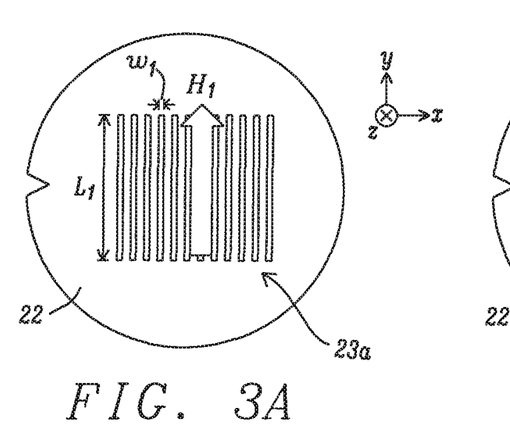
FIG. 3A and FIG. 3B are top-down views of a single set of stripes where first in-plane ($H_1$) and second in-plane ($H_2$) magnetic fields, respectively, are applied parallel and perpendicular to the long axis dimension according to a second embodiment of the present disclosure.
Figure 3B:
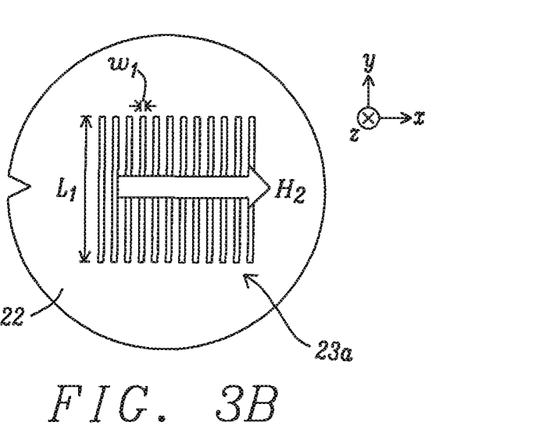

In a second embodiment depicted in FIG. 3A-3B, only one set of stripes 23a is formed on WUT 22. A first in-plane field ($H_1$) is applied parallel to the long axis (y-axis) of stripes 23a in FIG. 3A, and then a second in-plane field ($H_2$) is applied transverse to the long axis in FIG. 3B according to the FMR measurement method disclosed herein. Alternatively, $H_2$ is applied first and then $H_1$ is applied in a second step. Dimensions $L_1$ and $w_1$ are retained from the first embodiment. In some embodiments, the wafer chuck 20 and WUT (FIG. 1) may be rotated 90 degrees between application of $H_1$ and application of $H_2$. In an alternative embodiment, the mounting plate with the magnetic assembly and RF probes is rotated 90 degrees while the WUT is maintained in a constant position. Thus, a microwave frequency (f) is applied to at least one location on at least one elongated stripe to induce a ferromagnetic resonance condition therein for each pair of $H_1$ and f values, and for each pair of $H_2$ and f values, wherein a fixed $H_1$ and fixed $H_2$ that is greater than the perpendicular anisotropy field ($Hk_{eff}$) is applied while sweeping through a range of microwave frequencies, or a fixed frequency is applied while sweeping through a range of $H_1$ and $H_2$ values.

In both system configurations (FIG. 2 and FIGS. 3A-3B), the in-plane magnetic field is applied either parallel or transverse to the long axis of stripes. If FMR experiments are carried out by sweeping the magnetic field (H) at different microwave frequencies (f1, . . . , fn), a resonance field difference (ΔHr) between both in-plane magnetic field orientations is obtained at a fixed microwave frequency (f1, f2, . . . or fn) where ΔHr=Hry−Hrx; and where Hrx is the observed resonance field for in-plane magnetic fields parallel to the long axis, and Hry is the observed resonance field for in-plane magnetic fields transverse to the long axis. Note that ΔHr relies on a non-negligible Ny or Nx demagnetizing factor due to the large asymmetric lateral dimensions of such magnetic stripes (or any other elongated patterned magnetic structure). Thus, the contribution to the FMR conditions of such non-negligible term will be different depending on the magnetic field orientation. Alternatively, if FMR experiments are carried out by sweeping the microwave frequencies (f) at different in-plane magnetic field amplitudes (H1, H2, . . . , Hn), a resonance frequency difference (Δfr) between both in-plane magnetic field orientations is obtained at a fixed magnetic field amplitude (H1, H2, . . . or Hn) where Δfr=fry−frx; and where frx is the observed resonance frequency for in-plane magnetic fields parallel to the long axis, and fry is the observed resonance frequency for in-plane magnetic fields transverse to the long axis.

Figure 4A:
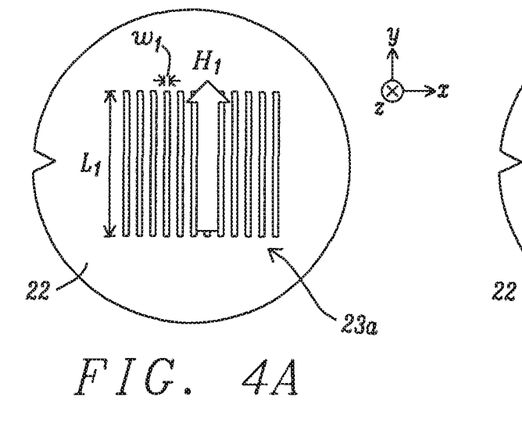
FIG. 4A and FIG. 4B are top-down views of a single set of stripes where first in-plane ($H_1$) and second perpendicular-to-plane ($H_2$) magnetic fields, respectively, are applied with respect to the long axis dimension according to another embodiment of the present disclosure.
Figure 4B:
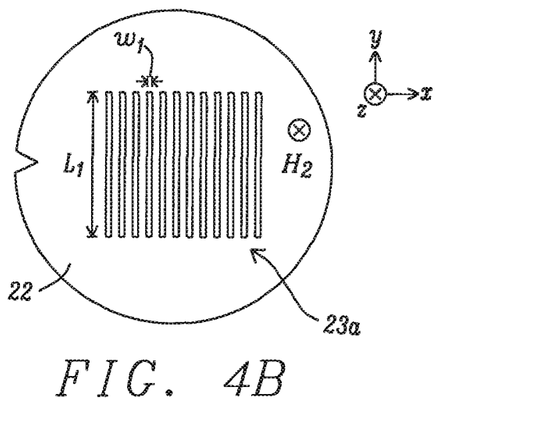

In yet another embodiment depicted in FIGS. 4A-4B that represents a modification of the second embodiment, the first magnetic field ($H_1$) may be oriented in-plane (i.e. parallel to the long axis direction) as shown in FIG. 4A, and the second magnetic field ($H_2$) depicted in FIG. 4B is applied perpendicular to the plane of the WUT 22 so that two different magnetic field orientations are applied to the magnetic film stripes 23a during two different time periods. In either case, the second orientation is orthogonal to the first orientation. The FMR measurement system that may be employed to provide the required perpendicular-to-plane field was previously described in related U.S. patent application Ser. No. 15/875,004, and may use either a transmission mode or reflectance mode for transmitting microwave signals to and from the magnetic film or magnetic structure.

In all of the aforementioned embodiments, an applied magnetic field H larger than the effective anisotropy field $H_{keff}$ is considered: $H > H_{keff}$ where $H_{keff} = 2 K_{eff}/Ms = 2(K_i/t - 2\pi Ms^2 Nz)/Ms)$, $K_{eff}$ is the effective anisotropy, and $K_i$ is the interfacial anisotropy. Accordingly, the resonance field conditions are given by:

$$f_{rx} = \frac{\gamma}{2\pi} \cdot \sqrt{\begin{array}{c}[H - (H_{keff} + 4\pi Ms \cdot Nx) + H_u \cdot \cos^2\phi] \cdot \\ [H - 4\pi Ms(Nx - Ny) + H_u \cdot \cos 2\phi]\end{array}} \quad \text{(Eq. 1)}$$

for $H > H_{keff}$ along the x-axis;

$$f_{ry} = \frac{\gamma}{2\pi} \cdot \sqrt{\begin{array}{c}[H - (H_{keff} + 4\pi Ms \cdot Ny) + H_u \cdot \sin^2\phi] \cdot \\ [H - 4\pi Ms(Ny - Nx) + H_u \cdot \cos 2\phi]\end{array}} \quad \text{(Eq. 2)}$$

for $H > H_{keff}$ along the y-axis; and $$f_{rz} = \frac{\gamma}{2\pi} \cdot \sqrt{\begin{array}{c}[(H + H_{keff}) + 4\pi Ms \cdot Nx - H_u \cdot \cos^2\phi] \cdot \\ [(H + H_{keff}) + 4\pi Ms \cdot Ny - H_u \cdot \sin^2\phi] - \\ H_u^2 \cdot \sin^2\phi \cdot \cos^2\phi\end{array}} \quad \text{(Eq. 3)}$$

for $H$ along the z-axis where $H_u=2K_u/Ms$ and Ku is the in-plane uniaxial anisotropy at angle $\phi$ with respect to the x-axis, and $H_{keff}$ is the effective anisotropy field.

If Nx~0 (e.g. for L>10 μm in FIGS. 3A-3B), Equations 1-3 can be simplified:

$$f_{rx} = \frac{\gamma}{2\pi} \cdot \sqrt{\frac{[H - H_{keff} + H_u \cdot \cos^2\phi] \cdot}{[H + 4\pi Ms \cdot Ny + H_u \cdot \cos 2\phi]}} \quad \text{(Eq. 4)}$$

for $H > H_{keff}$ along the x-axis;

$$f_{ry} = \frac{\gamma}{2\pi} \cdot \sqrt{\frac{[H - (H_{keff} + 4\pi Ms \cdot Ny) + H_u \cdot \sin^2\phi] \cdot}{[H - (4\pi Ms \cdot Ny + H_u \cdot \cos 2\phi)]}} \quad \text{(Eq. 5)}$$

for $H > H_{keff}$ along the y-axis; and $$f_{rz} = \frac{\gamma}{2\pi} \cdot \sqrt{\begin{array}{c}(H + H_{keff} - H_u \cdot \cos^2\phi) \cdot \\ [(H + H_{keff}) + 4\pi Ms \cdot Ny - H_u \cdot \sin^2\phi] - \\ H_u^2 \cdot \sin^2\phi \cdot \cos^2\phi\end{array}} \quad \text{(Eq. 6)}$$

for H along the z-axis.

When the magnetic field direction is fixed with respect to the wafer and FMR is measured for elongated structures with the long axis parallel and transverse to the magnetic field orientation (FIG. 2), then the resonance frequency shift $\Delta fr = f_{ry} - f_{rx}$ and the resonance field shift $\Delta H_r = H_{ry} - H_{rx}$ between the two in-plane configurations will follow the following expressions:

$$\Delta fr^2 + 2\Delta fr \cdot f_{rx} = \left(\frac{\gamma}{2\pi}\right)^2 \cdot Dy \cdot (2Q_1 + Q_2 - Dy) \quad \text{(Eq. 7)}$$

$$\Delta H_r^2 + \Delta H_r \cdot (Q_1 + Q_2 - 2Dy) = Dy \cdot (2Q_1 + Q_2 - Dy) \quad \text{(Eq. 8)}$$

where:
$$Q_1 = H - H_{keff} + H_u \cdot \cos^2\phi$$
$$Q_2 = H + H_u \cdot \cos 2\phi$$
$$Dy = 4\pi Ms \cdot Ny$$
$$f_{rx} = \frac{\gamma}{2\pi} \cdot \sqrt{Q_1 \cdot [Q_2 + Dy]}$$

These expressions for $Q_1$, $Q_2$, $Dy$, $f_{rx}$ imply that:

$$\Delta fr = f_{rx} \cdot \left[-1 \pm \sqrt{1 + \frac{Dy \cdot (2Q_1 + Q_2 - Dy)}{Q_1 \cdot [Q_2 + Dy]}}\right] \quad \text{(Eq. 9)}$$

$$\Delta H_r = -\frac{[Q_1 + Q_2 - 2Dy]}{2} \cdot \left[1 \mp \sqrt{1 + \frac{4 \cdot Dy \cdot (2Q_1 + Q_2 - Dy)}{[Q_1 + Q_2 - 2Dy]^2}}\right] \quad \text{(Eq. 10)}$$

For sufficient high magnetic fields (H>>$H_{keff}$, $H_u$ or Dy), both $\Delta fr$ and $\Delta H_r$ are directly proportional to Ms, and the proportionality factor depends only on the geometric factor Ny:

$$\Delta fr \sim \left(\frac{\gamma}{2\pi}\right) \cdot 6\pi Ms \cdot Ny \quad \text{(Eq. 11)}$$

$$\Delta H_r \sim 6\pi Ms \cdot Ny \quad \text{(Eq. 12)}$$

Note that Equations 11 & 12 show that measurements of Ms in the first embodiment (FIG. 2) are not influenced by a possible in-plane uniaxial anisotropy. By contrast, measurements of the same set of stripes with two orientations of the magnetic field (FIGS. 3A-3B or FIGS. 4A-4B) would be sensitive to an in-plane anisotropy.

A first set of equations (Equations 7, 9 and 11), or a second set of equations (Equations 8, 10 and 12) are used when FMR experiments are carried out by sweeping the microwave frequency excitation at fixed external magnetic field amplitude, or by sweeping the external magnetic field amplitude at fixed microwave excitations, respectively. In either case, note that the FMR measurement from a first RF probe on a stripe 23a in FIG. 2 is inputted into equation 4 while a similar input from RF probe on a stripe 23b is used in equation 5 to determine $\Delta fr$ in equation 7 (or $\Delta Hr$ in equation 8) for each pair of applied field (H) and frequency (f) that induces FMR resonance in the magnetic film stripes. Note that when no in-plane uniaxial anisotropy is present (Ku and Hu=0), the same $\Delta Hr$ and $\Delta fr$ are obtained from the first and second embodiments (FIG. 2 and FIGS. 3A-3B).

Figure 8:
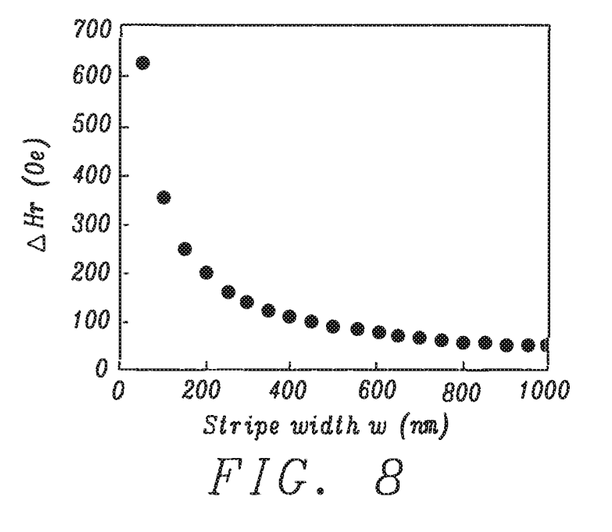
FIG. 8 is a plot illustrating variations in ΔHr as a function of stripe width for an in-plane magnetic field (H) of 40 kOe.

FIG. 8 shows an example of $\Delta Hr$ as a function of stripe width $w_1$ for a length L=10 μm, and thickness t=0.9 nm, Ms~1300 emu/cc, and an interfacial anisotropy Ki~1.45 erg/cm$^2$, and using an applied in-plane field (H) of 40 kOe. Note for such typical values, $\Delta Hr$ is larger than 100 Oe when w is smaller than 400 nm.

Equations 1-6 may also be used to calculate Ms from resonance conditions along various orientations of the applied field following the same method as described above.

Figure 5A:
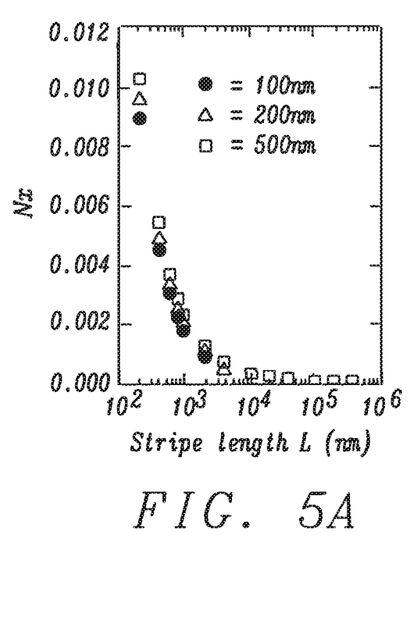
FIG. 5A-5C are plots showing the relationship between demagnetizing factors Nx, Ny, Nz, respectively, for a magnetic stripe of 1 nm thickness and different widths (w) as a function of stripe length (L).
Figure 5B:
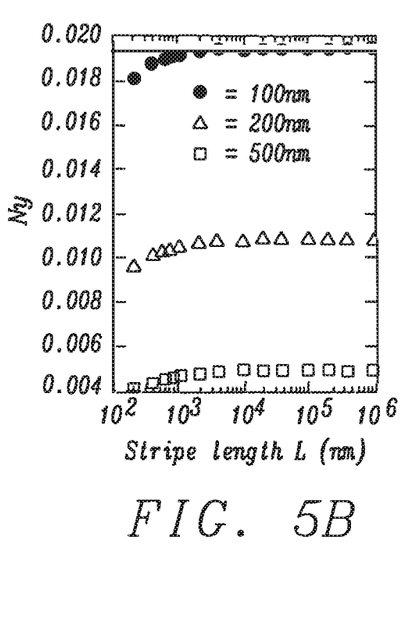
Figure 5C:
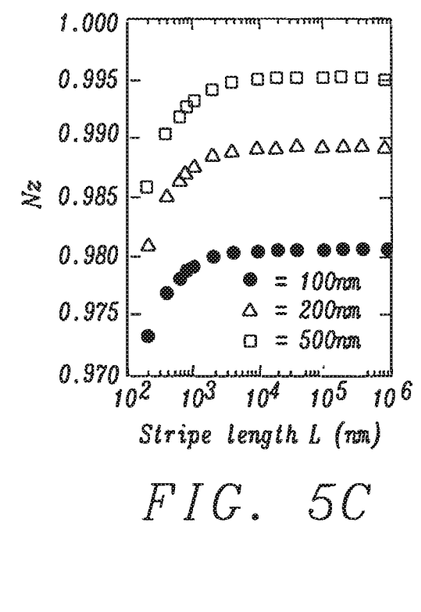
Figure 6A:
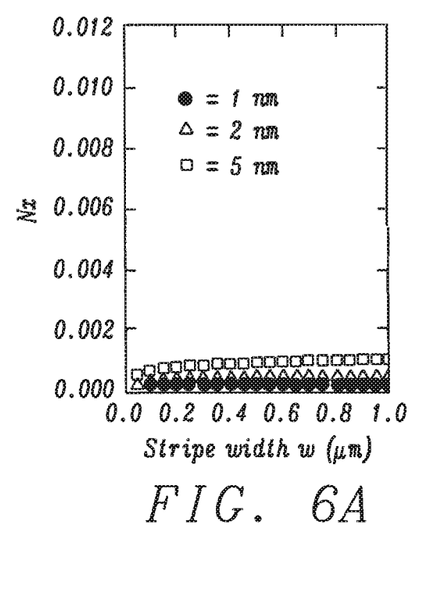
FIG. 6A-6C are plots showing the relationship between demagnetizing factors Nx, Ny, Nz, respectively, for a magnetic stripe of 10 microns in length, and with different widths (w) as a function of stripe thickness (t).
Figure 6B:
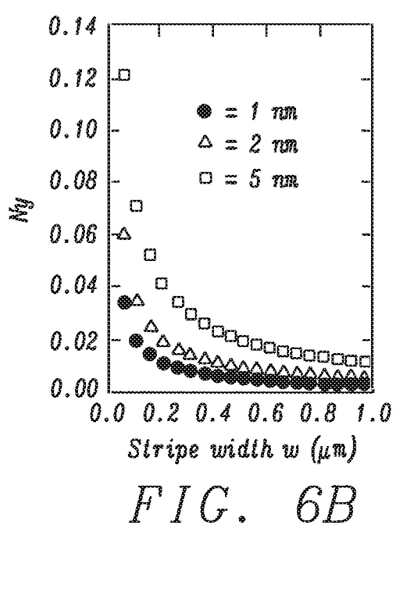
Figure 6C:
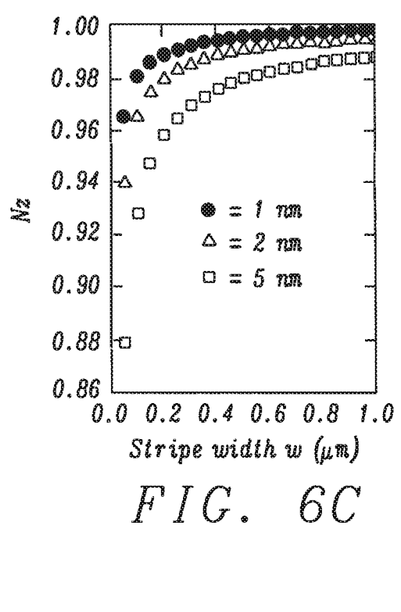

FIG. 5A, FIG. 5B, and FIG. 5C show Nx, Ny, and Nz, respectively, as a function of stripe length for different values of stripe width and a thickness of 1 nm according to "Demagnetizing factors for rectangular ferromagnetic prisms", A. Aharoni, J. Applied Physics 83, 432 (1998). On the other hand, FIG. 6A, FIG. 6B, and FIG. 6C show Nx, Ny, and Nz, respectively at various thicknesses as a function of stripe width for a 10 micron long magnetic stripe. Note that in both configurations, Nz is greater than Ny since stripe width is considerably larger than the thickness (1 nm, 2 nm, and 5 nm) and Nx is proximate to 0.

Figure 7A:
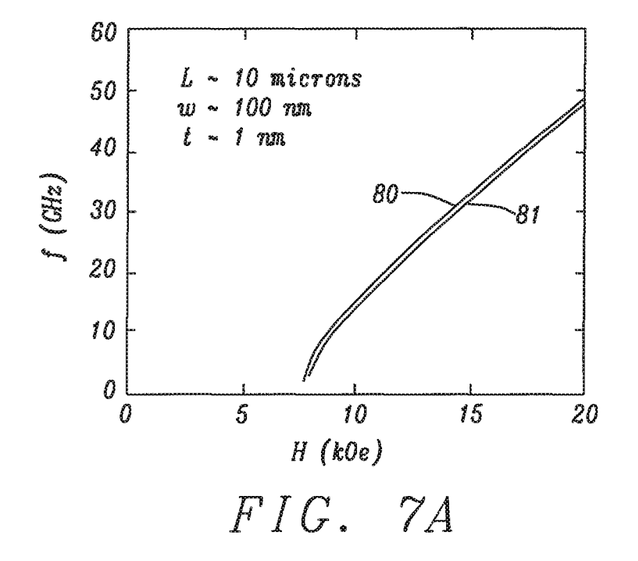
FIG. 7A is a plot showing FMR frequency vs. applied field for a magnetic stripe of L~10 microns, w~100 nm, and t~1 nm when the applied in-plane field (H) is parallel, or transverse to the stripes lengthwise direction.
Figure 7B:
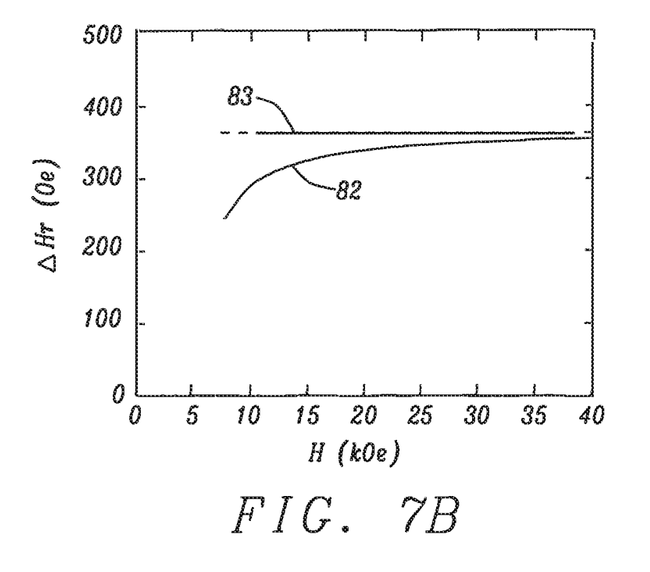
FIG. 7B is a plot showing the difference (solid line) between the FMR resonance fields for the two in-plane magnetic field configurations (ΔHr=Hrx−Hry) shown in FIG. 7A vs. applied field amplitude H, whereas the dashed line shows the limit value of ΔHr for high magnetic fields.

In FIG. 7A, resonance frequency (f) is plotted as a function of the applied field (H) following equations (Eq. 1 and Eq. 2) for magnetic stripes of length=10 microns, width=100 nm, and thickness=1 nm when H is parallel (curve 80) and transverse (curve 81) to the long axis of the striped pattern as in FIG. 2. In this example, no uniaxial anisotropy is considered (Ku=0), $Hk_{eff}$=7.4 kOe, and Ms=1000 emu/cc. With regard to FIG. 7B, the difference between the FMR resonance fields for the two in-plane configurations from FIG. 7A ($\Delta Hr$=Hry-Hrx) is plotted vs. applied field. The preferred operating region is proximate to the right end of curve 82 where curve 82 approaches dashed line 83 that shows the limit value for $\Delta Hr$=6πMs×Ny for high magnetic fields. It should be understood that as the ratio L/w increases, then $\Delta Hr$ becomes larger.

Figure 9:
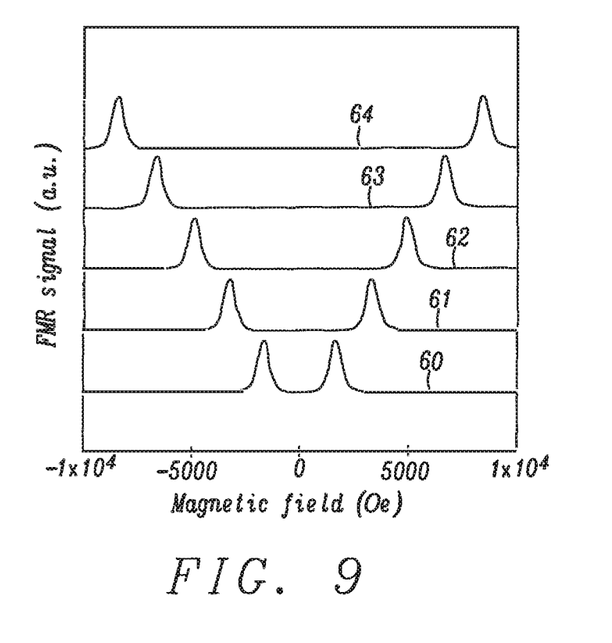
FIG. 9 is a plot of acquired data from a RF diode as a function of various applied magnetic fields at different RF microwave frequencies according to an embodiment of the present disclosure.

FIG. 9 depicts a typical data set. In this example, transmitted RF power is measured for five different frequencies as a function of the applied magnetic field on an uncut 8-inch diameter wafer (WUT). Curves 60, 61, 62, 63, and 64 are generated with RF frequencies of 20 GHz, 25 GHz, 30 GHz, 35 GHz, and 40 GHz, respectively, and sweeping the magnetic field between −1.0 Tesla and 1.0 Tesla (10000 Oe) according to a scanning FMR measurement method described in related U.S. patent application Ser. No. 15/875, 004. A FMR measurement at each $(x_i, y_i)$ coordinate on the magnetic film stripes requires about two minutes of process time. Therefore, total FMR measurement time for the entire wafer depends on the desired number of $(x_i, y_i)$ coordinates to be included when determining Ms, and Hk, γ, α, and L₀, if desired. It should be understood that the FMR measurement method disclosed herein may be performed on pieces of a wafer (coupons). However, as indicated earlier, the benefits of using a whole wafer are significant in terms of cost and convenience meaning that subjecting a coupon to the disclosed method is only done in special circumstances as in failure analysis.

While this disclosure has been particularly shown and described with reference to the preferred embodiment thereof, it will be understood by those skilled in the art that various changes in form and details may be made without departing from the spirit and scope of this disclosure.

What is claimed is:

1. A method comprising:
   forming a pattern in a magnetic material, the pattern including a first elongated structure and a second elongated structure;
   applying a first magnetic field to the first elongated structure and the second elongated structure while applying one or more first microwave frequencies to one or more first locations on each of the first and second elongated structures to induce a ferromagnetic resonance condition therein at the one or more first locations;
   determining a resonance field difference from a first resonance field measured at the one or more first locations on the first elongated structure and a second resonance field measured at the one or more first locations on the second elongated structure; and
   determining saturation magnetization from the resonance field difference.

2. The method of claim 1, wherein the first elongated structure is elongated along a first direction and the second elongated structure is elongated along a second direction that is orthogonal to the first direction.

3. The method of claim 1, wherein the applying of the first magnetic field to the first elongated structure and the second elongated structure includes applying the first magnetic field in-plane to the first elongated structure and the second elongated structure.

4. The method of claim 1, further comprising applying a second magnetic field to the first elongated structure and the second elongated structure while applying one or more second microwave frequencies to one or more second locations on each of the first and second elongated structures to induce a ferromagnetic resonance condition therein.

5. The method of claim 4, wherein the determining of the resonance field difference from the first resonance field measured at the one or more first locations on the first elongated structure and the second resonance field measured at the one or more first locations on the second elongated structure further includes determining the resonance field difference from a third resonance field measured at the one or more second locations on the first elongated structure and a fourth resonance field measured at the one or more second locations on the second elongated structure.

6. The method of claim 5, wherein the first elongated structure is elongated along a first direction and the second elongated structure is elongated along the first direction such that the first elongated structure is parallel to the second elongated structure.

7. The method of claim 6, wherein the applying of the second magnetic field to the first elongated structure and the second elongated structure includes applying the second magnetic perpendicular-to-plane of the first elongated structure and the second elongated structure.

8. A method comprising:
   forming a pattern in a magnetic material, the pattern including a first elongated structure and a second elongated structure;
   applying a first magnetic field to the first elongated structure and the second elongated structure while applying a first microwave frequency to one or more first locations on each of the first and second elongated structures to induce a ferromagnetic resonance condition therein at the one or more first locations;
   determining a resonance frequency difference from a first resonance frequency at the one or more first locations on the first elongated structure and a second resonance frequency at the one or more first locations on the second elongated structure; and
   determining saturation magnetization from the resonance frequency difference.

9. The method of claim 8, wherein the first elongated structure has a first length measured in a first direction and a first width measure in a second direction that is orthogonal to the first direction,
   wherein the second elongated structure has a second length measured in the second direction and a second width measure in the first direction, and
   wherein the first length is greater than the first width and the second length is greater than the second width.

10. The method of claim 8, wherein the applying of the first magnetic field to the first elongated structure and the second elongated structure includes applying the first magnetic field in-plane to the first elongated structure and the second elongated structure.

11. The method of claim 8, further comprising applying a second magnetic field to the first elongated structure and the second elongated structure while applying a second microwave frequency to one or more second locations on each of the first and second elongated structures to induce a ferromagnetic resonance condition therein.

12. The method of claim 11, wherein the determining of the resonance frequency difference from the first resonance frequency at the one or more first locations on the first elongated structure and the second resonance frequency at the one or more first locations on the second elongated structure further includes determining the resonance frequency difference from a third resonance frequency measured at the one or more second locations on the first elongated structure and a fourth resonance frequency measured at the one or more second locations on the second elongated structure.

13. The method of claim 12, wherein the first elongated structure has a first length measured in a first direction and a first width measure in a second direction that is orthogonal to the first direction,
   wherein the second elongated structure has a second length measured in the first direction and a second width measure in the second direction, and
   wherein the first length is greater than the first width and the second length is greater than the second width.

14. The method of claim 13, wherein the applying of the second magnetic field to the first elongated structure and the second elongated structure includes applying the second magnetic perpendicular-to-plane of the first elongated structure and the second elongated structure.

15. A method comprising:
   applying one or more magnetic fields and one or more microwave frequencies to first and second elongated structures disposed on a wafer;

determining either a resonance field difference or a resonance frequency difference, wherein the resonance field difference is determined from a first resonance field measured at one or more first locations on the first elongated structure and a second resonance field measured at one or more first locations on the second elongated structure, wherein the resonance frequency difference is determined from a first resonance frequency at the one or more first locations on the first elongated structure and a second resonance frequency at the one or more first locations on the second elongated structure; and determining saturation magnetization from either the resonance field difference or the resonance frequency difference.

16. The method of claim 15, wherein the applied magnetic field (H) is up to 10 Tesla, and
wherein the applied microwave frequency is in a range of 0.01 GHz to 100 GHz.

17. The method of claim 15, wherein the elongated structures have a substantially rectangular, or substantially elliptical shape.

18. The method of claim 15, wherein the first elongated structure is wider than the second elongated structure.

19. The method of claim 1, wherein the applying of the first magnetic field to the first elongated structure and the second elongated structure while applying the one or more first microwave frequencies to the one or more first locations on each of the first and second elongated structures includes applying a fixed first microwave frequency while sweeping through a range of first magnetic field amplitudes.

20. The method of claim 8, wherein the applying of the first magnetic field to the first elongated structure and the second elongated structure while applying the first microwave frequency to the one or more first locations on each of the first and second elongated structures includes applying a fixed first magnetic field while sweeping through a range of first microwave frequencies.

* * * * *